(12) United States Patent
Kimura

(10) Patent No.: US 6,322,875 B1
(45) Date of Patent: Nov. 27, 2001

(54) TRANSPARENT DECORATION KEY TOP AND ITS MANUFACTURING METHOD

(75) Inventor: Tohru Kimura, Tokyo (JP)

(73) Assignee: Polymatech Co., Ltd. (JP)

( * ) Notice: Subject to any disclaimer, the term of this patent is extended or adjusted under 35 U.S.C. 154(b) by 0 days.

(21) Appl. No.: 09/056,297

(22) Filed: Apr. 7, 1998

(30) Foreign Application Priority Data

Apr. 15, 1997 (JP) .................................................. 9-111741

(51) Int. Cl.[7] ................................ B32B 27/14; B32B 3/00
(52) U.S. Cl. .......................... 428/195; 428/336; 428/688; 428/698; 428/702
(58) Field of Search ..................................... 428/195, 215, 428/688, 698, 702, 336, 332; 427/248.1

(56) References Cited

U.S. PATENT DOCUMENTS 5,527,596 * 6/1996 Kimock et al. .......................... 428/216
5,594,231 * 1/1997 Pellicori et al. ........................ 235/462

* cited by examiner

Primary Examiner—Bruce H. Hess
Assistant Examiner—B. Shewareged
(74) Attorney, Agent, or Firm—McGlew and Tuttle, P.C.

(57) ABSTRACT

A manufacturing method of (1) a decorative and transparent key top made by layering of an inorganic thin membrane 5, which has a membrane thickness between 2 nm and 500 nm and 70% or more of visible rays transmittance, on the surface or back side of the resin-made key top 3, characterized by rainbow-colored luster, assembled in a push-button switch of handy telephone tools, handy terminal apparatuses, remote controllers of home electronic goods, card-type remote controllers, and various keyboards, and yielding the absence of striped pattern and irregular color tone, letters and the presence of symbols easy to look, and even, thick, rainbow-colored luster with beautiful, high-class appearance, (2) of a decorative and transparent key top characterized by layering of high-polymer protecting membrane 6 with a thickness between 5 μm and 60 μm on an inorganic thin membrane 5, and (3) of a decorative and transparent key top by forming an inorganic thin membrane 5 having a membrane thickness of 2 nm~500 nm and 70% or more transparency of visible rays on the surface and/or back side of a molded resin-made key top 3 or on the base material 11 made of high-polymer material by physical or chemical vacuum evaporation method by dropping unhardened liquid resin to react and harden, and (4) a manufacturing method of a decorative and transparent key top by forming a high-polymer protecting membrane 6 with a membrane thickness between 5 μm and 60 μm by layering of unhardened, liquid resin on an inorganic thin membrane 5 to harden.

8 Claims, 2 Drawing Sheets

TRANSPARENT DECORATION KEY TOP AND ITS MANUFACTURING METHOD

FIELD OF THE INVENTION

The present invention relates to a transparent decoration key top having a fine and high-grade aspect and a manufacturing method thereof which is used for mobile phones, mobile information terminals, remote controls used for various home electric appliances, card-remote controls and various kinds of keyboards.

BACKGROUND OF THE INVENTION

In conventional methods of decorating a key top of a push button switch with metallic luster or pearl luster tone, the following methods are known, for example, a method of molding by mixing metallic powder or pearl pigments in resin or rubber ingredients, a method of painting or screen-process-printing paints containing metallic powder or pearl pigments, a method of preparing a metallic film of aluminum chrome, or the like. on the surface of the key-top by vacuum evaporation method or sputtering method, and a method of metal plating.

However, the method of molding by mixing metallic powder or pearl pigment with resin and rubber causes a lack of uniformity in a stripped pattern or color tone by distorted dissemination of powder because of difficulty of uniform dispersion of pulverulent body. On the other hand, though the key-top which is obtained by preparing the metallic film of aluminum or chrome on the surface of a formed body by the vacuum evaporation method or the sputtering method presents a metallic luster, it is not of transparent quality with a rainbow-colored brilliance.

Also, with regards to resin key-tops put into push button switches of recently used mobile phones, mobile terminals, various kinds of home electric appliances, card remote controls and various kinds keyboards, and so on, the demand for the key-tops having a fine and high-grade aspect is becoming stronger.

SUMMARY OF THE INVENTION

The present invention solves the problems as described above and offers the transparent decoration key-top having a fine aspect with a rainbow-colored brilliance. That is to say, the present invention relates to the transparent decoration key-top, which comprises an inorganic thin film with film thickness of 2 nm~500 nm and with 70% or more, transmittance of visible rays on the surface or the reverse surface of a resin key-top which has rainbow-colored brilliance.

In this connection, the transmittance of visible rays in the present invention relates to a measured value.

According to the present invention, by preparing a specified inorganic thin film on the surface and/or the reverse surface of the resin key-top, the transparent decoration key-top with a fine and high-grade aspect, having a rainbow-colored brilliance mainly composed of red color, yellow color, blue color, purple color, etc. which have never been realized before and the manufacturing method thereof can be offered.

DETAILED DESCRIPTION OF THE PREFERRED EMBODIMENT

Figure 1:
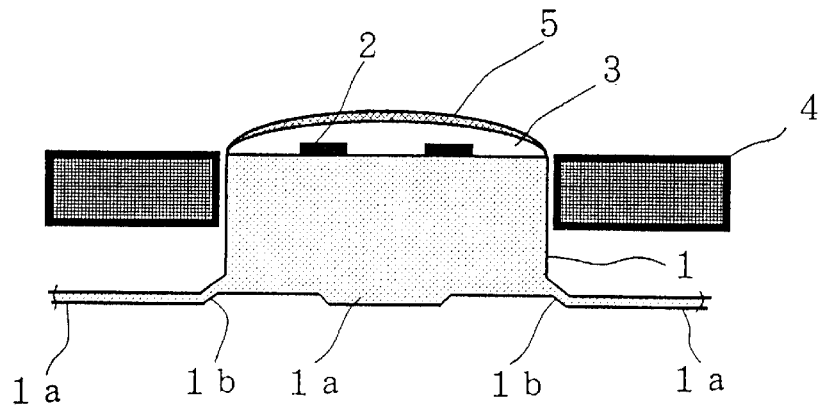
Fig.1 is a longitudinal sectional view, showing a push button switch installed to the transparent decoration keytop according to a first embodiment.

The present invention will be described more in details as follows.

A resin key-top as used in the present invention is the resin key-top made from reaction hardening of a resin keytop molded by die or unhardened liquid resin. More concretely, the key-top can be manufactured by using a die of the desired key-top shape and by filling in the die with the resin or liquid unhardened resin heated and melted by injection molding, compression molding, transfer molding, rotating molding, or the like and then by hardening.

Although no restriction is imposed on a composition or a kind of the resin, elastic modulus and color tone, it is especially desirable to use polyurethane, ester series thermoplastic elastomer, styrene series thermoplastic elastomer, and nylon series thermoplastic elastomer, all of which have a good transparency. It may be allowed to use ABS resin, crystalline polyester such as PET or PBT, liquid polymer, and semi-transparent or a little colored resin such as fluorine resin, etc. It is also possible to use silicon resin, unsaturated polyester, diallylphthalato, acryl series resin, publicly known resin such as heat hardenability, beam hardenability and humidity hardenability, etc. of urethane resin, and so on.

The push button switch constitution can be made by fixing the key-top by an adhesive or a duplicated tape to the base member of the push button switch having an operating/non-operating portion formed of synthetic rubber such as silicon rubber or etylene propylene series rubber and thermoplastic elastomer The above also includes the publicly known constitution made from a dichromatic molding of the well known thermoplastic elastomer and rigid resin or thermoplastic elastomer.

Further, according to the present invention, by using the resin key-top treated with reaction hardening by dropping unhardened liquid resin on the basic materials made from PET, nylon, film such as polyurethane and sheet-like high polymer materials in addition to synthetic rubber such as silicon rubber printed with characters and signs and a molded body of thermoplastic elastomer, the transparent key-top especially of a fine aspect with rainbow-colored brilliance can be obtained.

Basic materials made from high polymer materials may be allowed to have a constitution installed in advance by press molding with an operating portion and non-operating portion of a switch.

As for a dropping method, no specific restriction is given to a dispenser method, a pad printing method and a transcription method in addition to a potting method.

The resin key-top can be formed without using the above described die. As for the liquid resin used in this instance, an epoxy resin, and a thermoset resin, a photo-curing resin and moisture hardenability such as diallylphthalato can be cited.

In order to improve adhesion of the basic materials made from high polymer materials with these liquid resins, it is desirable to give the surface of the basic materials a short wave ultraviolet rays irradiation, a corona treatment or a coupling agent treatment, or the like. For example, the instances as based on a manufacturing method of a silicon key switch with a resin key-top as described in Japanese Patent Application Laid-Open No. 5150/1994 and a manufacturing method of a key sheet with a transparent resin key-top as described in Japanese Patent Application Laid-Open No. 5151/1994 can be applied.

The transparent decoration key-top of the present invention is characteristic in that an inorganic thin film with a film thickness of 2 nm~500 nm and an inorganic thin film with 70% or more transmittance of visible rays is laminated on the surface and /or the back face of the above described key-top. If the total beam transmittance is less than 70%, transparency is not enough and it becomes difficult to distinguish characters and signs printed on a substrate. The desirable beam transmittance is more than 75%, or more agreeably, more than 80%. If the thickness of the inorganic thin film is thinner than 2 nm, the rainbow-colored brilliance becomes light and, if more than 500 nm, it is not desirable because the transparency becomes deteriorated. As a practical matter, though it depends on a kind of the resin used, a refractive ratio and a shape and also materials, a refractive ratio and color tones, etc. of inorganic materials, the range of the thickness within 5 nm~500 nm creates the key-top of a fine aspect with rainbow-colored brilliance mainly composed of red color, yellow color, blue color, purple color, etc. which have never been realized before.

The materials according to of the present invention are metals such as aluminum, platinum, copper or alloy, metallic oxide, metallic nitride, metallic sulfide and a mixture or a lamination layer of these materials. More concretely, metallic oxide such as titanium oxide, silicon oxide, iron oxide, magnesia oxide, etc., metallic nitride such as nitride silicon, nitride aluminum, nitride titanium, etc., metallic fluoride such as fluoride magnesia, fluoride cerium, fluoride lead, etc. and metallic carbide such as titanium carbide, siliconcarbide, etc. are most ideal. Best of all, if titanium oxide, iron oxide and a single thin film of zinc sulfide or a lamination layer thin film of more than two kinds of these materials are used, the transparent decoration key-top of a fine aspect with rainbow colored brilliance can be obtained. These inorganic thin films can be prepared uniformly without irregularities by physical evaporation methods such as vacuum evaporation method, sputtering method, ion-plating method, or heat Chemical Vapor Deposition (CVD) method, plasma CVD method, beam CVD method, or the like. Regarding a vapor deposition equipment and vapor deposition conditions, though those already implemented in general can be used, it is desirable to use the vapor deposition equipment having an electronic beam heating source. Further, in order to improve adhesion of the key-top resin with the inorganic thin film, it may be alright to use the vapor deposition device containing a iron assist mechanism. As for metallic oxide, there is an oxidation number available. Citing titanium oxide as an example, there are such materials known as $TiO$, $Ti_2O_3$, $Ti_3O_5$, $Ti_4O_7$ in addition to $TiO_2$. By using these materials, it is possible to solve problems such as oxygen being dissolved from materials when materials are heated, thereby lowering vapor deposition pressure and it may be alright to use these materials to continuously and steadily perform a vapor deposition. Also, it may be alright to introduce for vapor deposition gas such as oxygen, nitrogen, etc. which is considered to be short when metallic oxide or metallic nitride, etc. are laminated in layer. As a preliminary treatment for film making, the key-top is treated as publicly known with an under coat and adhesion of the inorganic thin film can be thus improved.

Although it may depend on a kind of the resin key-top to be used and the inorganic materials used for the film making, in view of adhesion, temperature and a manufacturing cost thereof, the most economical method is the vacuum evaporation method or the sputtering method, which makes it possible to get the desired transparent decoration key-top of a fine aspect and a high grade touch with rainbow-colored brilliance.

Although the inorganic thin film may be allowed to be made for the other part than the key-top, it is desirable to make it selectively only for the necessary key-top portion treated with a masking.

According to the present invention, in case of the constitution wherein the above described inorganic thin film is exposed on the surface, unhardened liquid resin is further laminated on the inorganic thin film and, by hardening and forming a high polymer protecting film with thickness of 5 $\mu$m~60 $\mu$m, the inorganic thin film of rainbow-color can be chemically and physically stabilized. Though a specific restriction is not imposed on a kind and application of the liquid resin and hardening method, or the like, by using monomer and oligomer such as acrylic series, urethane series, silicon series, epoxy series, ester series, or the like, of thermosetting type, photo-curing type and moisture hardenability and also by laminating and hardening through methods such as spray painting, various kinds of printing, potting, or the like, a high polymer protection film of 5 $\mu$m~60 $\mu$m can be formed. It does not matter if this high polymer protection film is of no color, but if the colored film of red, blue yellow, etc. is used, the color tone will further change and it is quite possible to perform optional coloration.

In the case that the film thickness is less than 5 $\mu$m, a mechanical property of the high polymer protection film becomes weak and it is impossible to sufficiently protect the inorganic thin film. While, in the case that the film thickness is more than 60 $\mu$m, clearness of the rainbow-colored brilliance becomes dull and the fine aspect will be harmed. More desirable thickness of the high polymer protecting film is within the range of 15 $\mu$m~45 $\mu$m. Also, a plurality of the high polymer protecting films can be laminated.

The present invention is concretely described referring to the following examples and comparisons. The following embodiments are to be considered in all respects as illustrative and not restrictive.

EXAMPLE 1

FIG. 1 is a longitudinal view showing a push-button switch fitted with a transparent resin-made key top that is explained in the example 1 of this invention. In the FIG. 1, base member 1 is composed of a non-moving part 1a and moving part 1b, which are formed with transparent silicon rubber, and a top face, which is printed with a given printed layer 2 of letters or symbols by screen printing method. The top face is received short-wave ultraviolet rays by the same method of the invention described in Japanese Patent Application Laid-Open 1994-5150, treated with silane-coupling agent followed by dropping acrylic resin, which is hardened with ultraviolet rays, to harden by radiating ultraviolet rays, and finally to form a resin-made key top 3 made of transparent acrylic resin. The surface of the resin-made key top is washed with ethanol, covered with a mask 4 made of stainless steel to avoid vacuum evaporation, treated with vacuum evaporation of tungsten oxide for 12 minutes in vacuum evaporation equipment under the condition of a vacuum evaporation pressure of 5×10$^{-4}$ Torr and membrane forming speed of 5 nm/minute to make inorganic thin membrane 5 made of tungsten oxide with membrane thickness of 60 nm and 87% transmittance of visible rays.

As the result, a push-button switch fitted with a decorative transparent key top is produced with rainbow colored surface luster mainly with purple.

EXAMPLE 2

By the vacuum evaporation method as same as that of the EXAMPLE 1, an inorganic thin membrane made of tungsten oxide was produced with membrane thickness of 100 nm and 85% transmittance of visible rays upon the surface of resin key top made of transparent acrylic resin.

EXAMPLE 3

By the vacuum evaporation method as same as that of the EXAMPLE 1, an inorganic thin membrane made of tungsten oxide was produced with membrane thickness of 140 nm and 84% transmittance of visible rays upon the surface of resin key top made of transparent acrylic resin.

The resin key top of a push-button switch obtained showed an excellent transparent appearance with rainbow-colored surface luster mainly with yellow.

Thus, in the EXAMPLES 1–3 differently colored rainbow surface luster was shown by simple change of membrane thickness of tungsten oxide only.

EXAMPLE 4

As same as the EXAMPLE 1, the top face is received ion beam radiation under the condition of the presence of oxygen gas and a vacuum evaporation pressure of 5×10$^{-4}$ Torr in an electronic beam vacuum evaporation equipment fitted with ion assist mechanisms to produce an inorganic thin membrane made of titanium oxide with membrane thickness of 40 nm and 86% transmittance of visible rays by vacuum evaporation of titanium oxide with a membrane forming speed of 4 nm/min for 10 minutes.

The resin-made key top of a push-button switch obtained showed an excellent transparent appearance with rainbow-colored surface luster mainly with blue.

EXAMPLE 5

By the vacuum evaporation method as same as that of the EXAMPLE 1, an inorganic thin membrane made of ferric oxide was produced with membrane thickness of 50 nm and 83% transmittance of visible rays upon the surface of resin key top made of transparent acrylic resin.

The resin key top of a push-button switch obtained showed an excellent transparent appearance with rainbow-colored surface luster mainly with red.

EXAMPLE 6

Figure 2:
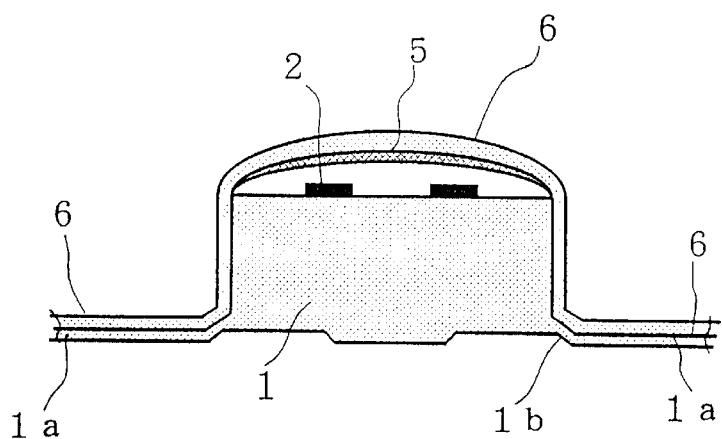
FIG. 2 is a longitudinal sectional view, showing the push button switch according to another embodiment.

FIG. 2 is a longitudinal view showing a push-button switch fitted with a transparent resin-made key top that is explained in the example 6 of this invention.

Transparent urethane paint (Originplate Z made by Origin Electric Inc.) was applied to a push-button switch fitted with a decorative and transparent key top with rainbow-colored luster by formation of thin membrane of titanium oxide 5, dried to harden, and finally layered with a high-polymer protecting layer 6 of a membrane thickness of 30 μm on the thin membrane 5.

The inorganic thin membrane exposed on the surface made by the vacuum evaporation of tungsten oxide was protected with the high-polymer protecting layer.

EXAMPLE 7

Figure 3:
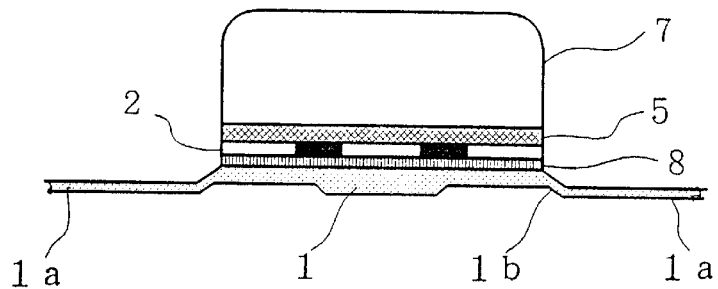
FIG. 3 is a longitudinal sectional view, showing the push button switch according to another embodiment.

FIG. 3 is a longitudinal view showing a push-button switch fitted with a transparent resin-made key top that is explained in the example 7 of the present invention.

In the FIG. 3 as same as that of the EXAMPLE 1, the non-moving part 1a and moving part 1b of the base member 1 are formed with transparent silicon rubber.

In addition, polycarbonate was injected for molding by using armold to make a resin-made key top 7 made of polycarbonate. Next, the back side of the resin-made key top was washed with ethanol, titanium oxide was spattered with Argon as a spattering gas for 10 minutes in a spattering apparatus under the condition of spattering pressure of 5×10$^{-4}$ Torr and membrane-forming speed of 5 nm/min, inorganic thin membrane 5 with a membrane thickness of 50 nm and 83% transmittance of visible rays was formed with titanium oxide, and finally a transparent resin-made key top having rainbow-colored surface luster mainly with yellow was obtained.

In addition, by screen printing of acrylic ink upon the surface, a printed layer 2 of letters or symbols is formed. Thermosetting silicon adhesive 8 was applied to the letter or symbol-printing face, the face was adhered to the base member 1 to harden by heating to form a push-button switch fitted with a decorative and transparent key top with rainbow-colored luster.

EXAMPLE 8

Figure 4:
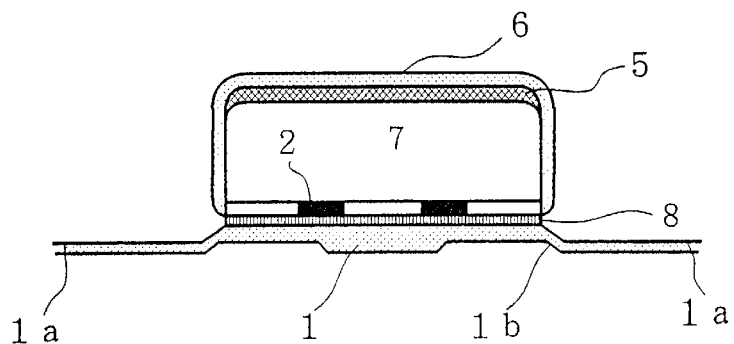
FIG. 4 is a longitudinal sectional view, showing the push button switch according to another embodiment.

FIG. 4 is a longitudinal view showing a push-button switch fitted with a transparent resin-made key top that is explained in the example 8 of the present invention.

As same as the EXAMPLE 7, an inorganic thin membrane 5 with membrane thickness of 50 nm and 85% transmittance of visible rays was produced with tungsten oxide on the surface of the molded resin-made key top 7 made of polycarbonate. The resin-made key top obtained by forming a printed layer 2 of a letter or a symbol on the back side of the key top showed an excellent transparent appearance with rainbow-colored surface luster mainly with blue.

In addition, transparent urethane paint as same as that of the EXAMPLE 6 was applied to the resin-made key top only to form the high-polymer protecting layer 6 and then the protecting layer 6 was adhered to the base member 1 by using cyanoacrylate adhesive 8 to produce a push-button fitted with transparent resin-made key top.

COMPARISON 1

AS same as the EXAMPLE 1, an inorganic thin membrane made of aluminum with a membrane thickness of 120 nm and 65% transmittance of visible rays was formed on the surface of a resin-made key top made of transparent acrylic resin by vacuum evaporation method. The obtained resin-made key top of the push-button switch showed unclear, simple metal color lacking transparency and rainbow-colored luster.

COMPARISON 2

AS same as the EXAMPLE 7, an inorganic thin membrane with the membrane thickness of 600 nm and 68% transmittance of visible rays was formed with tungsten oxide on the back side of the resin-made key top made of molded polycarbonate by vacuum evaporation method.

The resin-made key top of the push-button obtained showed yellow color and less transparency and did not show rainbow-colored surface luster.

COMPARISON 3

AS same as the EXAMPLE 7, an inorganic thin membrane with the membrane thickness of 30 nm and 64% transmittance of visible rays was formed with gold on the back side of the resin-made key top made of molded polycarbonate by spattering method.

The resin-made key top of the push-button obtained mainly showed red color and less transparency and did not show rainbow-colored surface luster.

Figure 5:
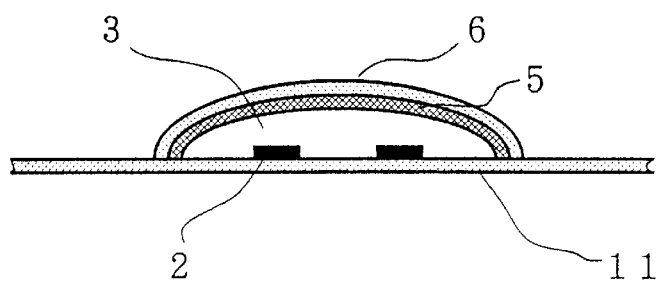
FIG. 5 is a longitudinal sectional view, showing another example of the push button switch of the present invention.

FIG. 5 shows another example of a push-button switch fitted with a decorative and transparent key top of the present invention and base member 11 and resin-made key top 3 are composed of polyester sheet and epoxy thermosetting resin, respectively.

Figure 6:
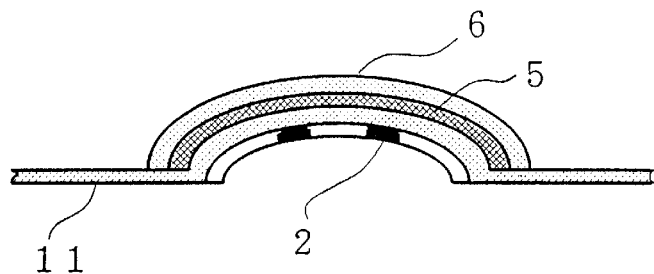
FIG. 6 is a longitudinal sectional view, showing another example of the push button switch of the present invention.

FIG. 6 shows another example of a push-button switch fitted with a decorative and the resin-made key top 3 was made by heat-press molding of polyester sheet of the base member 11.

Figure 7:
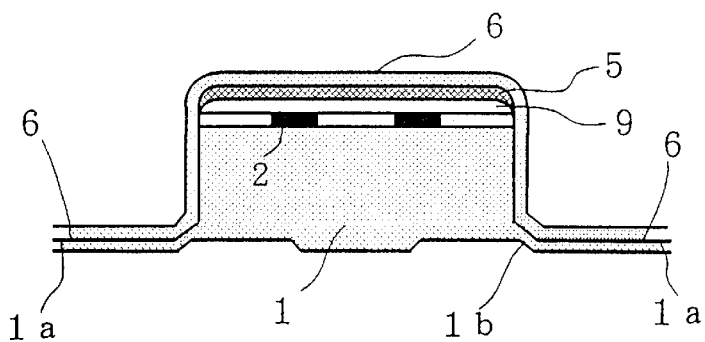
FIG. 7 is a longitudinal sectional view, showing another example of the push button switch of the present invention.

FIG. 7 shows another example of a push-button switch fitted with a decorative and transparent key top of the present invention and the base member 1 of the non-moving part 1a and moving part 1b is composed of transparent polyester elastomer made by injection molding. An undercoat layer 9 is layered on the base member 1 to cover a printed layer 2 of a letter or symbol. The same results same as those described in former examples will be obtained for the decorative and transparent key tops of the structure shown in the FIGS. 5 to 7.

What is claimed is:

1. A decorative and transparent key, comprising:
   a transparent key base member;
   a transparent resin portion;
   a printed layer provided between said transparent key base member and said transparent resin portion;
   an inorganic thin membrane which has a membrane thickness between 2 nm and 500 nm and has a 70% or more transmittance of visible rays, said inorganic thin membrane being provided on a front surface of said transparent resin portion, or between said transparent resin portion and said printed layer, or between said printed layer and said transparent key base member.

2. The decorative and transparent key according to claim 1, wherein the key is part of one of a push-button switch of a hand held telephone, a hand held terminal apparatus, a remote controller of a home electronic product, a card remote controller, and a keyboard.

3. The decorative and transparent key according to claim 1, wherein said inorganic thin membrane is made of one or more material(s) selected from titanium oxide, silicon oxide, ferric oxide, magnesium oxide, tungsten oxide, aluminum oxide, chromium oxide, cobalt oxide, tantrum oxide, indium oxide, sin oxide, nickel oxide, manganese oxide, zirconium oxide, vanadium oxide, cerium oxide, bismuth oxide, antimony oxide, zinc oxide, hafcium oxide, silicon nitride, aluminum nitride, titanium nitride, magnesium fluoride, cerium fluoride, lead fluoride, silicon carbide, titanium carbide, zinc sulfide, silicon, and geranium.

4. The decorative and transparent key according to claim 1, further comprising:
   an additional layer including a high-polymer protecting membrane with the thickness of 5 $\mu$m~60 $\mu$m on said inorganic thin membrane.

5. The decorative and transparent key according to claim 1, wherein said inorganic thin membrane is provided on one of said front surface of said transparent resin portion and said reverse surface of said transparent resin portion by a physical or chemical vacuum evaporation method after dropping liquid, unhardened resin to harden.

6. The decorative and transparent key according to claim 1, further comprising a layer of unhardened and liquid resin layered on a surface of said inorganic thin membrane to form a hardened high-polymer protecting membrane with the thickness of 5 $\mu$m~60 $\mu$m.

7. The decorative and transparent key according to claim 3, further comprising:
   an additional layer including a high-polymer protecting membrane with the thickness of 5 $\mu$m~60 $\mu$m on said inorganic thin membrane.

8. A decorative and transparent key, comprising:
   a transparent key base;
   a transparent resin portion;
   a printed layer provided between said resin portion and said transparent key base;
   an inorganic thin membrane which has a membrane thickness between 2 nm and 500 nm and has a 70% or more transmittance of visible rays, said inorganic thin membrane being provided on a front surface of said transparent resin portion, or between said transparent resin portion and said printed layer, or between said printed layer and said transparent key base member.

* * * * *